US007472472B2

(12) United States Patent
Takanami (10) Patent No.: US 7,472,472 B2
(45) Date of Patent: Jan. 6, 2009

(54) ELECTRONIC PART MOUNTING APPARATUS

(75) Inventor: Yasuo Takanami, Kurume (JP)

(73) Assignee: Panasonic Corporation, Osaka (JP)

( * ) Notice: Subject to any disclaimer, the term of this patent is extended or adjusted under 35 U.S.C. 154(b) by 400 days.

(21) Appl. No.: 10/545,044

(22) PCT Filed: Dec. 15, 2004

(86) PCT No.: PCT/JP2004/019128

§ 371 (c)(1),
(2), (4) Date: Aug. 11, 2005

(87) PCT Pub. No.: WO2005/064640

PCT Pub. Date: Jul. 14, 2005

(65) Prior Publication Data

US 2006/0191131 A1    Aug. 31, 2006

(30) Foreign Application Priority Data

Dec. 26, 2003   (JP) .............................. 2003-433143

(51) Int. Cl.
   *B23P 19/00*   (2006.01)
(52) U.S. Cl. ............................ 29/740; 29/741; 29/743; 29/721; 29/834; 414/744.7
(58) Field of Classification Search .................. 29/739, 29/740–743, 712, 719–721, 834; 414/744.7; 901/17
See application file for complete search history.

(56) References Cited

U.S. PATENT DOCUMENTS

| | | | |
|---|---|---|---|
| 5,839,187 A | | 11/1998 | Sato et al. |
| 6,058,599 A | * | 5/2000 | Hanamura ................... 29/740 |
| 6,718,630 B2 | * | 4/2004 | Hada et al. ..................... 29/832 |
| 6,792,676 B2 | * | 9/2004 | Haji et al. ...................... 29/832 |
| 6,839,959 B1 | * | 1/2005 | Hosotani et al. ............... 29/740 |
| 6,874,225 B2 | * | 4/2005 | Haji et al. ...................... 29/740 |
| 6,999,184 B2 | * | 2/2006 | Yakiyama et al. ............ 356/614 |
| 7,025,244 B2 | * | 4/2006 | Haji .............................. 228/9 |
| 7,275,314 B2 | * | 10/2007 | Yakiyama et al. ............. 29/832 |
| 2003/0110623 A1 | | 6/2003 | Haji et al. |

FOREIGN PATENT DOCUMENTS

| | | |
|---|---|---|
| JP | 2003-188194 | 7/2003 |
| WO | WO 03/081974 | 10/2003 |

* cited by examiner

*Primary Examiner*—Minh Trinh
(74) *Attorney, Agent, or Firm*—Pearne & Gordon LLP (57) ABSTRACT

In an electronic part mounting apparatus provided with first, second and third beam members 31, 32 and 33, all supported by a common Y-axis frame at both ends thereof, holding a chip 6 by suction from an electronic part feeding unit 2 by means of a mounting head attached to the first beam member 31, and mounting the chip onto a substrate held by first and second substrate-holding units 10A and 10B, a supporting mechanism for the substrate-holding unit (an SHU-supporting mechanism) 10 is provided which supports a slide table 50, on which the first and second substrate-holding unit 10A and 10B are arranged, in such a manner that the slide table is movable between an operating position P1 and a maintenance position P2. With such configuration, the slide table 50 can be moved to the maintenance position P2 easily accessible for maintenance, leading to the improvement of working efficiency.

20 Claims, 11 Drawing Sheets

ELECTRONIC PART MOUNTING APPARATUS

TECHNICAL FIELD

The present invention relates to an electronic part mounting apparatus which mounts an electronic part on a substrate.

BACKGROUND ART

Semiconductor chips which are cut off from a semiconductor wafer into individual pieces and are in the state of being adhered to a wafer sheet are detached from the wafer sheet by an electronic part mounting apparatus to be implemented on a substrate such as a lead frame. As a type of the electronic part mounting apparatus performing transport and mounting operations for electronic parts, there is a known one with a configuration that arranges in series an electronic part feeding unit which holds a wafer sheet and feeds semiconductor chips and a substrate-holding unit which holds a substrate, and a moving beam which is equipped with a working head holding a semiconductor chip by suction above these units whereby the moving beam is configured so as to be freely movable (See, for example, Japanese Patent Laid-open No. 2003-188194).

In this example of patent literature, in addition to the movable beam equipped with the above-cited working head, two movable beams are provided, one having a camera for substrate recognition and the other having a camera to recognize a semiconductor chip at the electronic part feeding unit, whereby these movable beams are supported by a supporting frame at both ends thereof. The apparatus is designed so as to achieve efficient part mounting operations by moving these three movable beams in cooperation all together.

DISCLOSURE OF INVENTION

But, with respect to the electronic part mounting apparatus of the above-described configuration, a problem is pointed out that workability lowers by the hindered access during operations caused by the layout of the apparatus. Namely, the substrate-holding unit which holds a substrate transported from the upstream side needs be frequently accessed by an operator for the stage-changing operation accompanied by the type changing when the kind of the substrate is altered, the maintenance operation for exchanging an expendable part and coping with substrate jamming due to transport error.

However, in the configuration such as the one described above, in which a plurality of moving beams are arranged on a common supporting frame, together with the fact that the access from the side of the apparatus is hindered by the supporting frame, the accessibility to the substrate-holding unit from outside of the apparatus is hindered by the existence of the plural moving beams, thus resulting in the deterioration of working efficiency.

Accordingly, the invention has an object of providing an electronic part mounting apparatus capable of improving working efficiency by improving the accessibility to the substrate-holding unit from outside of the apparatus.

The electronic part mounting apparatus of the invention is provided with a nozzle which holds an electronic part by suction and which mounts the electronic part on a substrate by holding the electronic part with said nozzle by suction, the electronic part mounting apparatus includes a base table, a substrate-holding unit which is arranged in the central portion of the base table and holds said substrate, a substrate transport mechanism which brings in the substrate to the substrate-holding unit or carries out the substrate from the substrate-holding unit by transporting the substrate in a substrate transport direction (X direction), a pair of supporting frames arranged in both sides of the substrate so as to straddle the substrate transporting route defined by the substrate transport mechanism, an electronic part feeding unit arranged sideways to the substrate-holding unit between the pair of the supporting frames on said base table, a beam member which is held by said supporting frames at both ends thereof so as to be freely movable in the Y direction almost perpendicular to said substrate transport direction, a Y-axis moving mechanism which moves the beam member in the Y direction whereby the moving range includes the space above said substrate-holding unit and the space above said electronic part feeding unit, a mounting head which is held by said beam member so as to be freely movable in the X direction, an X-axis moving mechanism which move the mounting head in the X direction, and a supporting mechanism for the substrate-holding unit (abbreviated to SHU-supporting mechanism, hereinafter) which supports said substrate-holding unit in such a manner that the substrate-holding unit can move between an operating position where bringing in or carrying out of the substrate by said substrate transport mechanism is possible and a maintenance position arranged remote from said electronic part feeding unit in the Y direction beyond this operating position.

According to the invention, working efficiency can be improved via the improvement of the accessibility to the substrate-holding unit from outside by adopting a configuration equipped with an SHU-supporting mechanism which supports the substrate-holding unit in such a manner that the substrate-holding unit can move between an operating position where bringing in or carrying out of the substrate by said substrate transporting mechanism is possible and a maintenance position arranged remote from the electronic part feeding unit beyond this operating position.

BEST MODE FOR CARRYING OUT THE INVENTION

Figure 1:
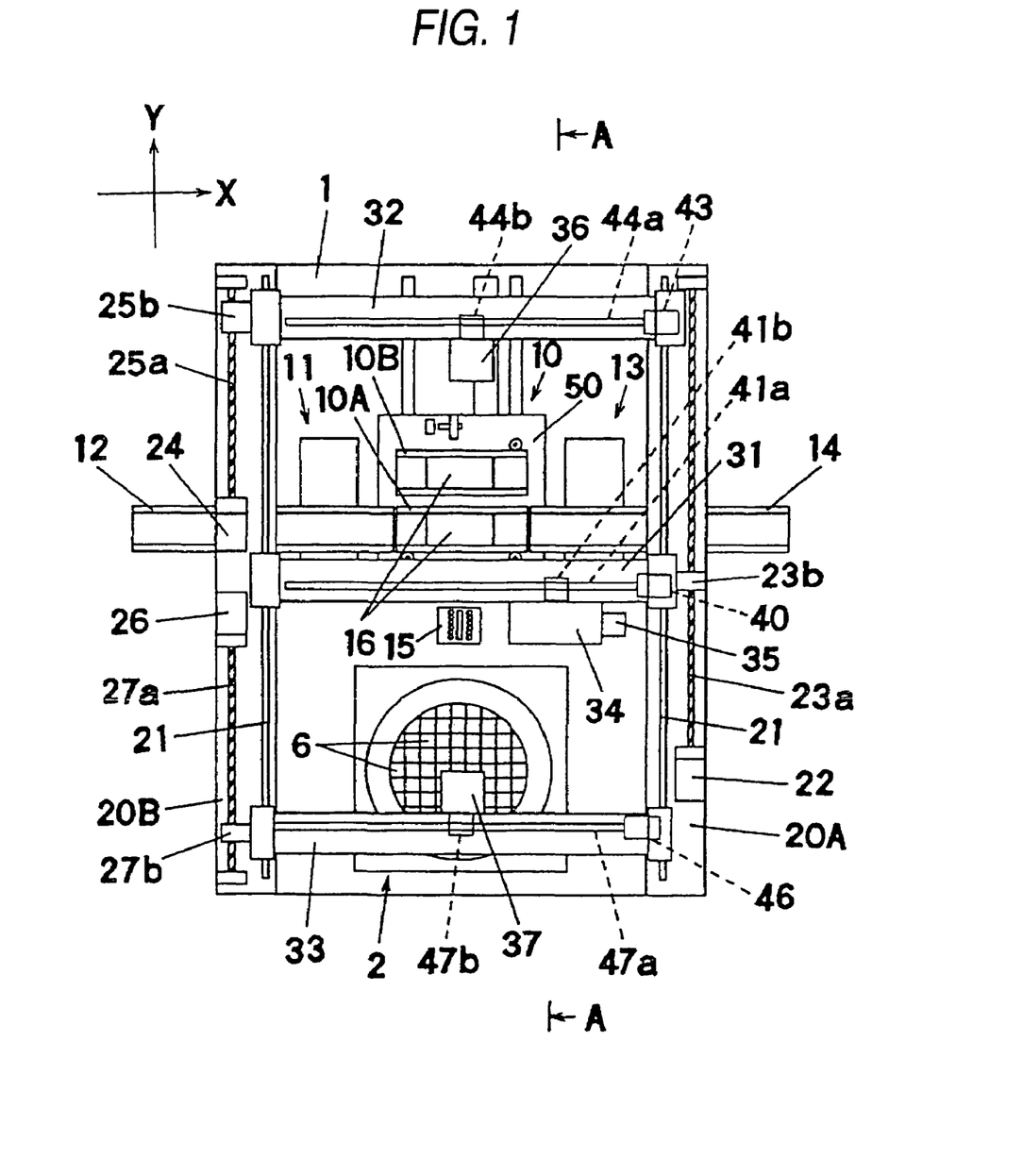
FIG. 1 is a plan view of an electronic part mounting apparatus as one embodiment practicing the invention.
Figure 2:
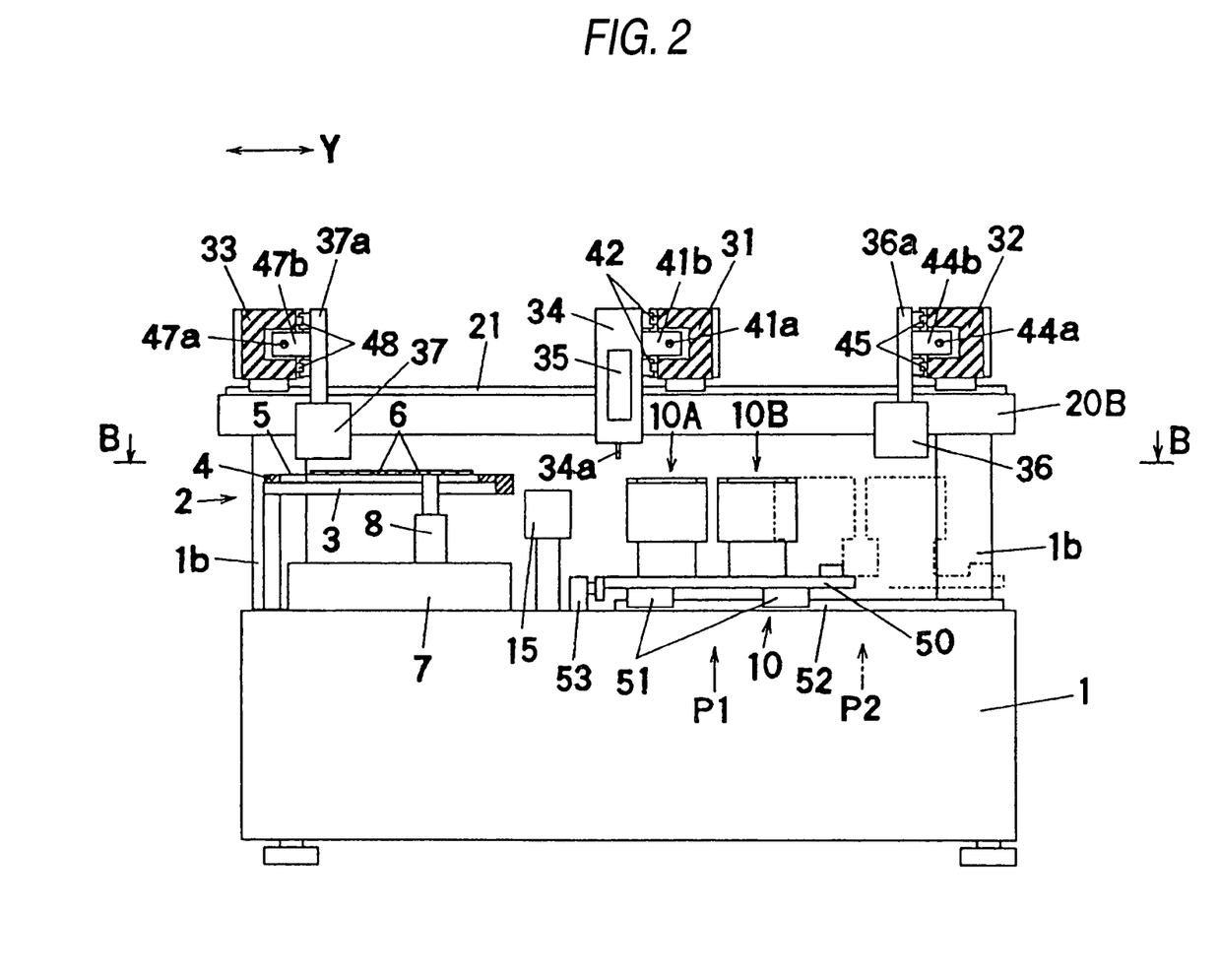
FIG. 2 is sectional side view of an electronic part mounting apparatus as one embodiment practicing the invention.
Figure 3:
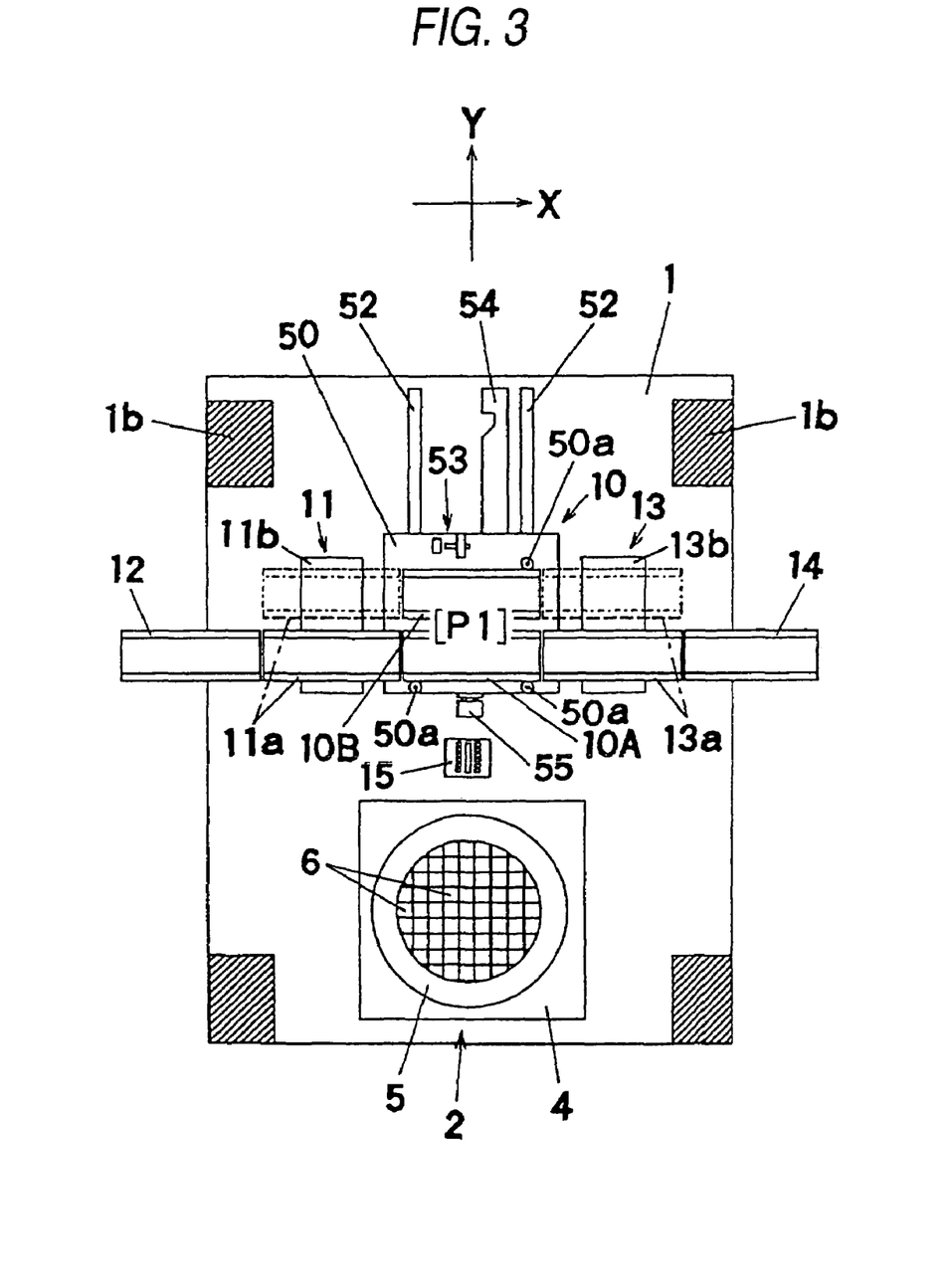
FIGS. 3 and 4 are sectional plan views of an electronic part mounting apparatus as one embodiment practicing the invention.
Figure 4:
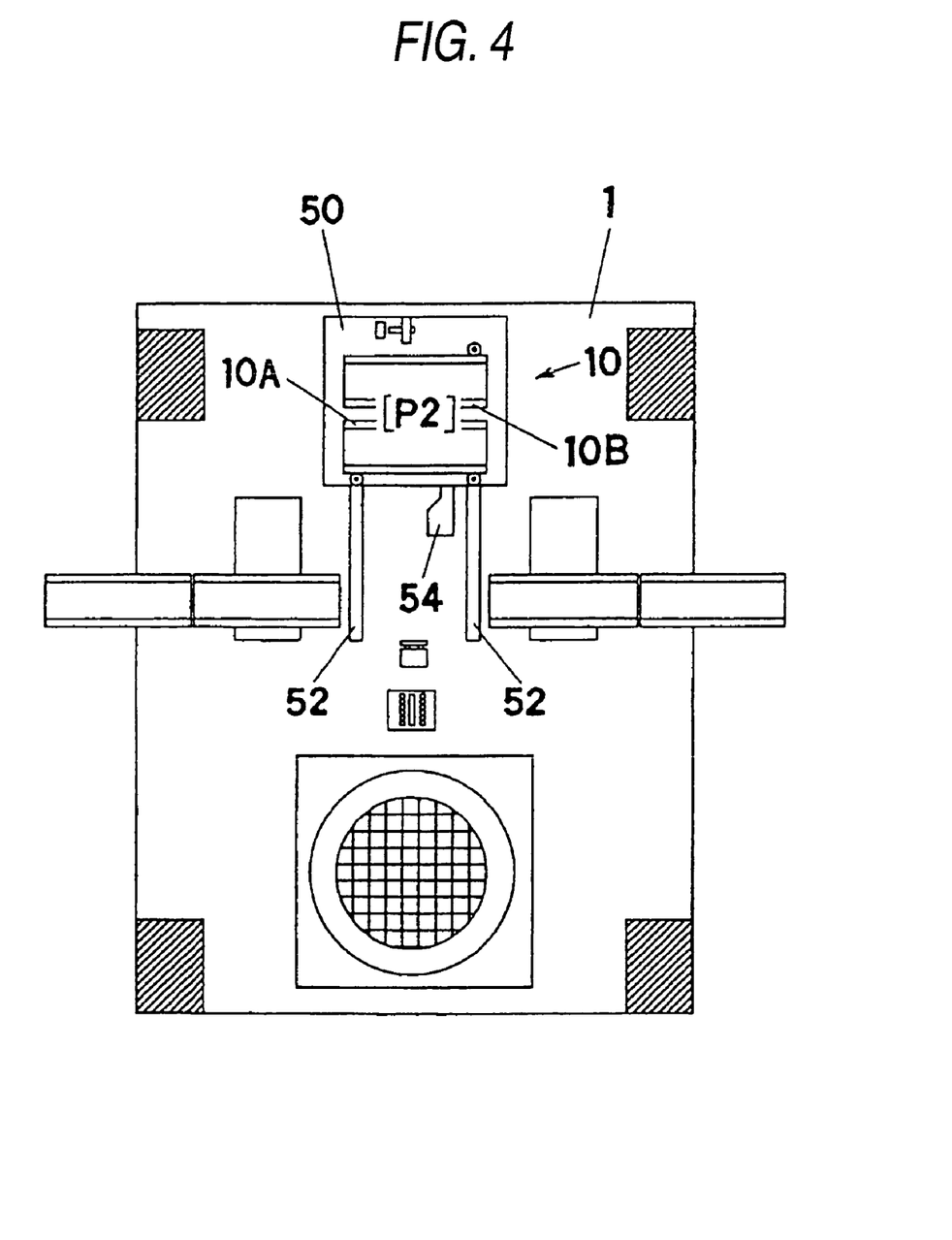

Next, some embodiments for practicing the invention are described with reference to the drawings. First of all, the whole configuration of the electronic part mounting apparatus is described with reference to FIGS. 1, 2, 3 and 4. FIG. 2 shows the view at the arrow A-A in FIG. 2, and FIGS. 3 and 4 show the views at the arrow B-B, respectively. In FIG. 1, on a base table 1 is arranged an electronic part feeding unit 2. As shown in FIGS. 2 and 3, the electronic part feeding unit 2 is provided with a jig holder (jig holding unit) 3, and the jig holder 3 holds a jig 4 mounted with an adhesive sheet 5 in freely attachable and detachable manner. On the adhesive sheet 5, semiconductor chips 6 (hereinafter, simply referred to as chips 6) as electronic parts are attached by adhesion in an individually separated state.

As is shown in FIG. 2, under the adhesive sheet 5 held by the jig holder 3, an ejector 8 is arranged in horizontally movable manner by means of an ejector XY table 7. The ejector 8 is provided with a pin elevating mechanism which elevates or lowers an ejector pin (not shown in the drawing) for pushing up the chip. And when the mounting head to be described later picks up chip 6 from the adhesive sheet 5, the ejector pin pushes up the chip 6 from beneath the adhesive sheet 5 to separate the chip 6 from the adhesive sheet 5. The ejector 8 constitutes an adhesive sheet separating mechanism that separates the chip 6 from the adhesive sheet 5.

As is shown in FIG. 3, in the central portion of the upper plane of the base table 1, an SHU-supporting mechanism 10 is arranged at a position remote from the electronic part-feeding unit 2 in the Y direction (the first direction). The SHU-supporting mechanism 10 supports the first substrate-holding unit 10A and the second substrate-holding unit 10B wherein the first substrate-holding unit 10A and the second substrate-holding unit 10B each hold a substrate 16 on which the chip 6 is to be mounted. In the upstream side of the SHU-supporting mechanism 10, a bringing-in conveyor 12 and a substrate allotting mechanism 11 are arranged, and, in the downstream side thereof, a substrate collection mechanism 13 and a carrying-out conveyor 14 are arranged both in series in the X direction.

To the bringing-in conveyor 12 is fed a substrate 16 coated with an adhesive by means of an upstream side device, and the substrate 16 after the adhesive coating is delivered to the substrate-allotting mechanism 11. The substrate-allotting mechanism 11 comprises an allotting conveyor 11a which is arranged slidable in the Y direction by means of a sliding mechanism 11b, and selectively allots the substrate 16 received from the bringing-in conveyor 12 to the first substrate-holding unit 10A or the second substrate-holding unit 10B both of which are arranged at the central portions of the base table 1. The first and second substrate-holding units 10A and 10B hold the substrate 16 allotted by the substrate-allotting mechanism 11 to position the substrate to the position to be mounted.

Similar to the substrate-allotting mechanism 11, the substrate collection mechanism 13 comprises a collection conveyor 13a which is arranged slidable in the Y direction by means of a sliding mechanism 13b, receives the substrate 16 after mounting by selectively connecting the collection conveyor 13a with the first or second substrate-holding unit 10A or 10B, and transfers the substrate to the taking-out conveyor 14. The taking-out conveyor 14 takes out the transferred mounted substrate 16 to the downstream side.

The bringing-in conveyor 12, the substrate-allotting mechanism 11, the substrate collection mechanism 13 and the carrying-out conveyor 14 constitute a substrate transport mechanism which brings in the substrate 16 to the first and second substrate-holding units 10A and 10B by transporting the substrate in the X direction, i.e., the substrate-transporting direction, or which takes out the substrate 16 from the first and second substrate-holding units 10A and 10B. By way of precaution, as the configuration of the substrate transport mechanism, substrate transport methods using advancing nails or a pusher, or substrate transportation based on the pick-and-place method may be employed in addition to the conveyor type one such as adopted in the present embodiment.

In FIG. 1, a pair of supporting frames, X-axis frames 20A and 20B are arranged in both sides of the upper plane of the base table 1 so as to straddle the substrate transport route defined by the above-described substrate transport mechanism and to cover substantially the whole length of the base table 1 in the Y direction. The layout on the base table 1 is such that the electronic part feeding unit 2 is positioned sideways to the first and second substrate-holding units 10A and 10B between the Y-axis frames 20A and 20B.

At a pair of first direction guides 21 arranged on the upper plane of the Y-axis frames 20A and 20B, a first beam member 31 (beam member), a second beam member 32 and a third beam member 33 are provided in such a manner as to be freely movable in the Y direction supported by the first direction guides 21 at both ends thereof. In other words, each of the first, second and third beam members 31, 32 and 33 is supported by the Y-axis frames 20a and 20B at both end thereof in such a manner as to be freely movable in the Y direction.

At the side end portion in the right of the first beam member 31, a nut member 23b is protruded, and a feed screw 23a threadably engaged with the nut member 23b is revolvably driven by a Y-axis motor 22 which is arranged in the horizontal direction on the first Y-axis frame 20A. By operating the Y-axis motor 22, the first beam member 31 moves horizontally in the Y direction along the first direction guide 21.

On the first beam member 31, a mounting head 34 equipped with an integrally movable first camera 35 on the side plane is supported in such a manner as to be freely movable in the X direction. And a feed screw 41a threadably engaged with a nut member 41b connected to the mounting head 34 is revolvably driven by an X-axis motor 40. By operating the X-axis motor 40, the mounting head 34 moves in the X direction guided by second direction guides 42 (Refer to FIG. 2.) equipped on the side plane of the first beam member 31 in the X direction. The X-axis motor 40, the feed screw 41a and the nut member 41b constitute a X-axis transport mechanism which transports the mounting head 34 in the X direction.

The mounting head 34, which has plural (4 in the present case) nozzles 34a each capable of holding a single chip 6 by suction, is configured so as to be movable while holding plural chips 6 by sucking a chip 6 to each nozzle 34a. By operating the Y-axis motor 22 and the X-axis motor 40, the mounting head 34 moves horizontally in the X and Y directions whereby the head picks up and holds the chips 6 in the electronic part feeding unit 2, and mounts the held chips 6 on the substrate 16 held by the first substrate-holding unit 10A or the second substrate-holding unit 10B.

And, along with the movement of the mounting head 34, the first camera 35 also moves integrally, and captures the image of the substrate 16 held by the first or second substrate-holding unit 10A or 10B. The Y-axis motor 22, the feed screw 23a and the nut member 23b constitute a Y-axis moving mechanism which moves the first beam member 31 in the Y direction whereby the moving range includes the space above the first and second substrate-holding units 10A and 10B and the space above the electronic part feeding unit 2.

At the left side end portion of the second and third beam members 32 and 33, nut members 25b and 27b are protruded, respectively, and feed screws 25a and 27a threadably engaged with nut members 25b and 27b are revolvably driven by Y-axis motors 24 and 26 which are arranged in the horizontal direction on the second Y-axis frame 20B, respectively. By operating the Y-axis motors 24 and 26, the second and third beam members 32 and 33 move horizontally in the Y direction along the first direction guide 21.

On the second beam member 32, a second camera 36 is equipped, and a nut member 44b is connected to a bracket 36a holding the second camera 36. The feed screw 44a threadably engated with the nut member 44b is revolvably driven by an X-axis motor 43. And by operating the X-axis motor 43, the second camera 36 moves in the X direction guided by second direction guides 45 (Refer to FIG. 2.) provided on the side plane of the second beam member 32.

By operating the Y-axis motor 24 and X-axis motor 43, the second camera 36 horizontally moves in the X and Y directions. By these movements, the second camera 36 can move above the first and second substrate-holding units 10A and 10B to capture the image of the substrate 16 held by these substrate-holding units 10A and 10B, and can further move to a retreating position (lying above the maintenance position to be described later) arranged remote from the electronic part feeding unit 2 in order to retreat from above these substrate-holding units. And by conducting recognition processing for the image of the substrate 16 after having mounted the electronic part captured by the second camera 36, inspection of the mounted condition of the chip 6 on the substrate 16 becomes possible.

Accordingly, in the configuration described above, the Y-axis motor 24, the feed screw 25a and the nut member 25b constitute a second Y-axis transport mechanism which shifts the second beam member 32 between the first and second substrate-holding units 10A and 10B and the retreating position arranged at a position remote from the electronic part-feeding unit 2 in the Y direction beyond the space above the first and second substrate-holding units 10A and 10B.

On the third beam member 33, a third camera 37 is mounted, and a nut member 47b is connected to a bracket 37a holding the third camera 37. A feed screw 47a threadably engaged with the nut member 47b is revolvably driven by an X-axis motor 46. And by operating the X-axis motor 46, the third camera 37 moves in the X direction guided by second direction guides 48 (Refer to FIG. 2.) provided on the side plane of the third beam member 33.

By operating the Y-axis motor 26 and X-axis motor 46, the third camera 37 horizontally moves in the X and Y directions. By these movements, the third camera 37 can conduct the movement above the electronic part feeding unit 2 for capturing the image of the chip 6 held by the electronic part feeding unit 2 and the movement for retreating from above the electronic part feeding unit 2. By conducting recognition processing on the image data captured by the third camera 37, the position of the chip 6 in the electronic part feeding unit 2 is detected.

As shown in FIG. 3, between the electronic part-feeding unit 2 and the SHU-supporting mechanism 10, a fourth camera 15 is arranged. The fourth camera 15 captures the image of the chip 6 held by the mounting head 34, since the mounting head 34 which has picked up the chip 6 at the electronic part feeding unit 2 moves in the X direction above the fourth camera 15.

As shown in FIGS. 2 and 3, the SHU-supporting mechanism 10 is configured of a slide table 50 on the upper plane of which the first and second substrate-holding units 10A and 10B are arranged in parallel whereby the slide table is arranged so as to freely movable along a guide rail 52 arranged on the base table 1 in the Y direction. Namely, the SHU-supporting mechanism 10 has a configuration comprising a slide table 50 which linearly moves roughly in the Y direction on the base table 1, on which the first and second substrate-holding units 10A and 10B are provided.

By moving the slide table 50, the first and second substrate-holding units 10A and 10B move between an operating position P1 (Refer to FIG. 3.), i.e., one where under an ordinary apparatus operating condition, the bringing in and carrying out of the substrate 16 by means of the substrate transport mechanism can be conducted and a maintenance position P2 (Refer to FIG. 4.), i.e., one which is arranged at a position remote from the electronic part-feeding unit 2 in the Y direction beyond the operating position P1, and which is easy for access during the stage-changing operation as well as the maintenance operation. In other words, the SHU-supporting mechanism 10 holds the first substrate-holding units 10A and 10B in such a manner that the two units can move between the operating position P1 and the maintenance position P2.

Next, with reference to FIGS. 5, 6, 7 and 8, the constitution of the SHU-supporting mechanism 10 is described. In two guide rails 52 arranged on the upper plane of the base table 1 in the Y direction, a slider 51 (Refer to FIG. 2, too.), which is fixed on the lower plane of the slide table 50, is equipped so as to be freely slidable in the Y direction. With this configuration, the slide table 50 is freely movable in the Y direction.

On the upper plane of the base table 1 between the guide rails 52 is arranged a positioning member 54 in the Y direction. In the movement of the slide table 50 in the Y direction, a catching mechanism 53 provided in the slide table 50 is caught by depressions 54a and 54b for position fixation provided in a positioning mechanism 54. By such action, the slide table 50 is configured so as to be positioned in the Y direction.

Figure 5:
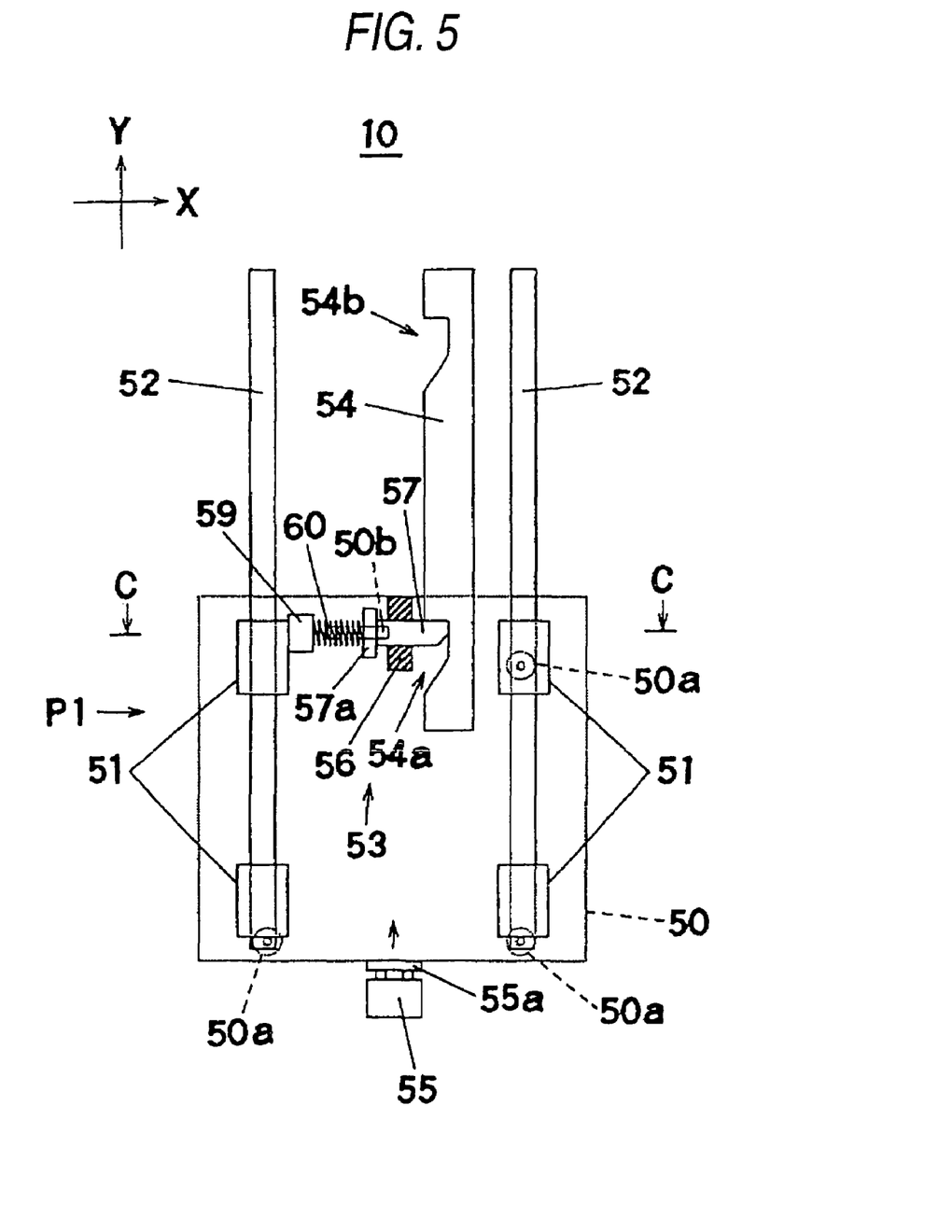
FIGS. 5, 6 and 7 are plan views of the SHU-supporting mechanism of an electronic part mounting apparatus as one embodiment practicing the invention.

As shown in FIG. 5, on the upper plane of the slide table 50 shown by broken lines, recognition marks 50a are provided at three points (Refer to FIG. 3, too.) in the vicinities of the diagonal positions. The recognition marks 50a are reference points optically detectable with a camera, and, as will be described soon, is provided for the purposes of judging whether the slide table 50 is held at a right position for the operating position P1, or of detecting the positional error caused by the thermal distortion of the relevant mechanisms such as the feed screw and the like.

As the reference observation camera capturing the image of the recognition marks 50a, either of the first camera 35 or the second camera 36 is appropriately used, as will be described later. By way of precaution, though the recognition marks 50a provided on the slide table 50 are used as the reference points here, the recognition marks as the reference points may be provided in the first and second substrate-holding units 10A and 10B.

Figure 8A:
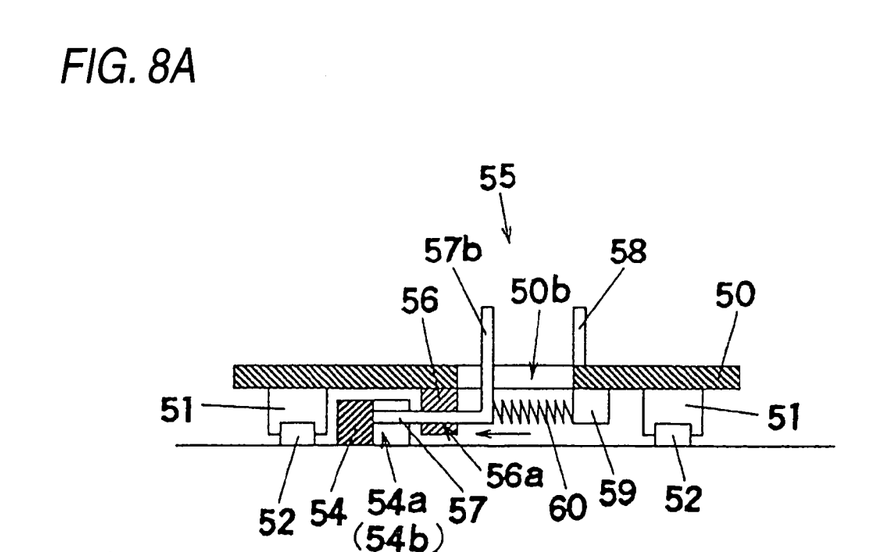
FIGS. 8A and 8B are sectional sides view of the SHU-supporting mechanism of an electronic part mounting apparatus as one embodiment practicing the invention.

Now, with reference to FIGS. 5 and 8, the structure and function of the catching mechanism 53 are described. FIG. 8A shows the C-C cross-section in FIG. 5. As is shown in FIG. 8A, at the edge in one side of the lower plane of the slide table 50, a holding block 56 through which a sliding hole 56a is provided is fixed. In the sliding hole 56a, a stopper 57 of L-letter shape is freely slidably inserted. Between a brim 57a provided in the stopper 57 and a block 59 fixed on the lower plane of the slide table 50, a compression spring 60 is equipped.

Since the stopper 57 is pushed against the positioning member 54 by means of the compression spring 60, the tip of the stopper 57 fits in the depression 54a or 54b provided in the positioning member 54. In the situation where the stopper 57 fits in the depression 54a, the slide table 50 is positioned in the side of the operating position P1, and in the situation where the stopper 57 fits in the depression 54b, the slide table 50 is positioned at the side of the maintenance position P2.

In the base table 1, a biasing mechanism 55 (Refer to FIG. 3, too.) for the position-fixing of the slide table 50 is provided.

The biasing mechanism 55 has a contacting member 55a which contacts with the edge plane of the slide table 50 by advancing or recessing in the Y direction. In the state where the stopper 57 fits in the depression 54a, the stopper 57 is pushed against the inner side plane of the depression 54a by operating the biasing mechanism 55 to push the contact member 55a against the edge plane of the slide table 50 in the arrow direction. By such mechanism, the position of the slide table 50 at the operating position P1 is fixed. Namely, the positioning member 54 having the depression 54a, the catching mechanism 53 and the pushing mechanism 55 constitute a fixing mechanism which fixed the slide table 50 at the operating position P1.

Figure 8B:
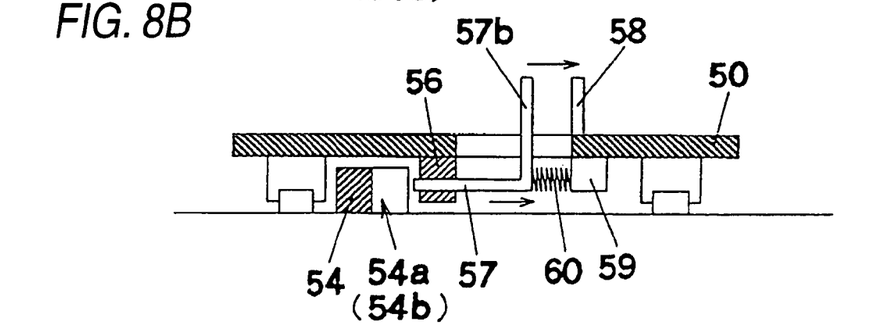

A handle unit 57b with a stopper 57 extending upward protrudes toward the upper plane side of the slide table 50 via a penetrating groove 50b provided in the slide table 50. At the edge of the penetrating groove 50b, a standing grip member 58 is provided at the position facing the handle unit 57b. And, as shown in FIG. 8B, when an operator holds the handle unit 57b and pulls it towards the side of the grip member 58, the stopper 57 is released from the depression 54a (or 54b). By this operation, the caught state of the slide table 50 by means of the catching mechanism 53 is released to make the slide table 50 movable in the Y direction.

Figure 6:
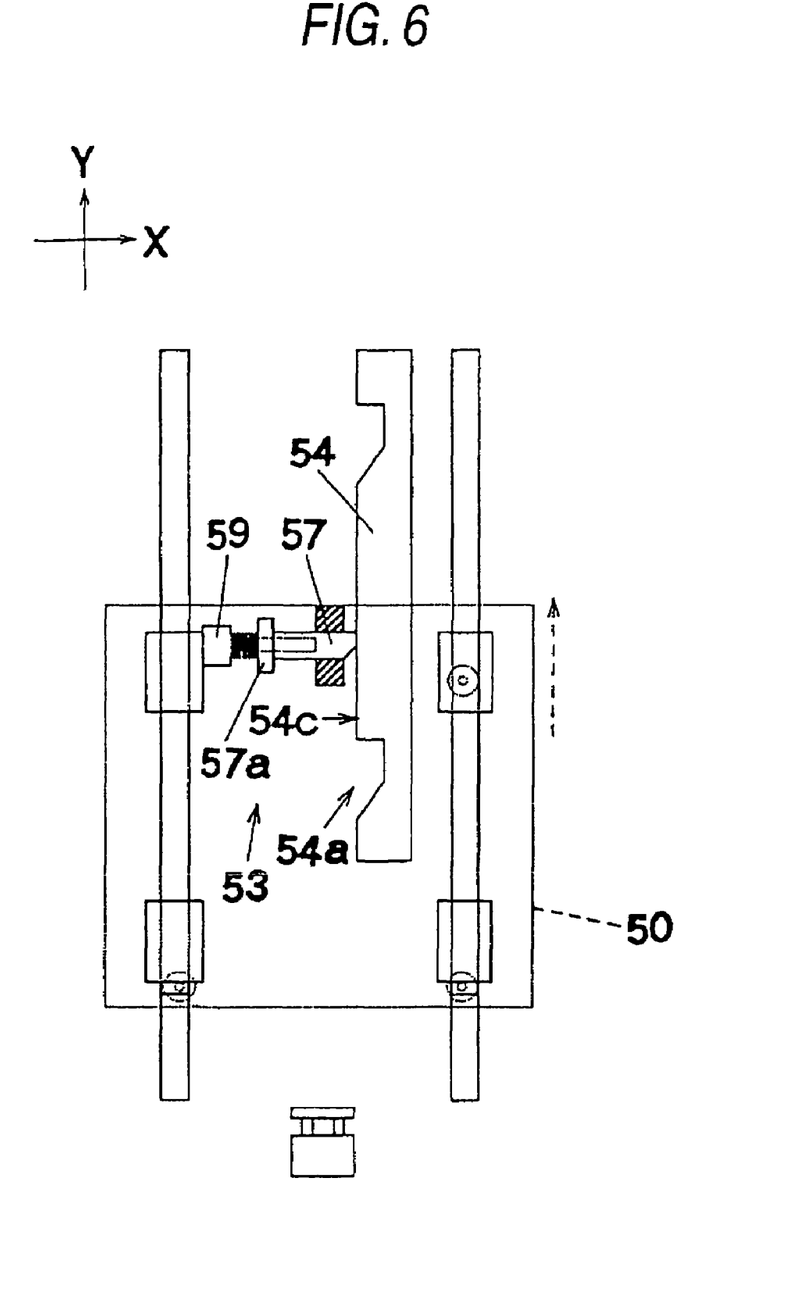
Figure 7:
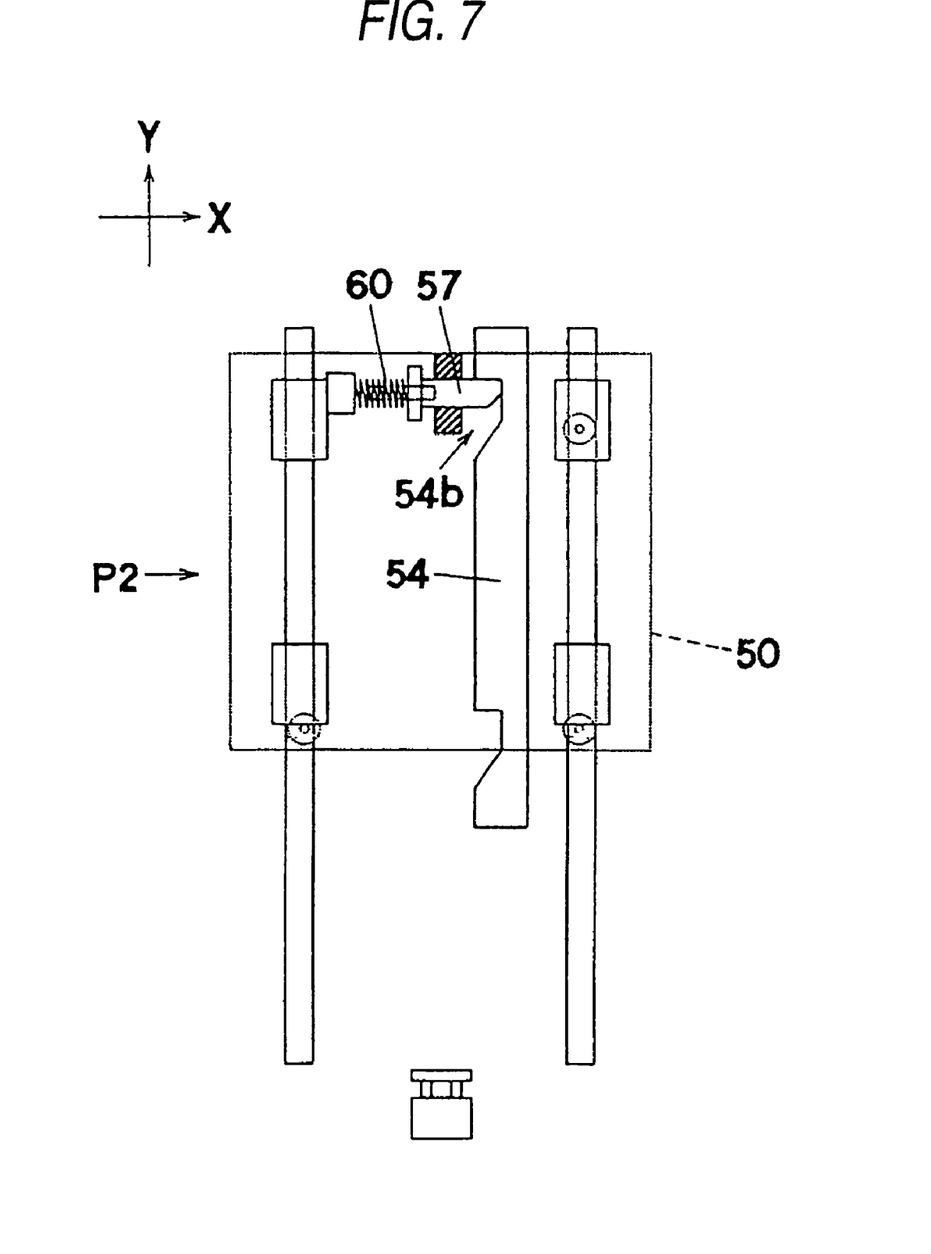

Namely, as shown in FIG. 8B, when the operator releases the stopper 57 from the depression 54a, and holds and pulls out the handle unit 57b and the grip member 58 in the Y direction to release the drawing to the X direction of the handle unit 57b, the tip of the stopper 57 comes in contact with the side edge plane 54c of the positioning member 54 as shown in FIG. 6. And, when the operator continues to hold the grip member 58 and pull out the slide table 50 in the Y direction under such a situation, the slide table 50 stops at the position where the stopper 57 fits in the depression 54b, i.e., the maintenance position P2.

In this way, by arranging an SHU-supporting mechanism 10 which supports the first and second substrate-holding units 10A and 10B so that the units are freely movable between the operation position P1 and the maintenance position P2, the problem is solved that accesses from outside of the apparatus to the first and second substrate-holding units 10A and 10B are hindered in an electronic part mounting apparatus of a configuration in which a plurality of beam members are moved along common Y-axis frames 20A and 20B arranged in both side of the first and second substrate-holding units 10A and 10B. By way of precaution, in case where a stage-changing operation and the like are conducted with the first and second substrate-holding units 10A and 10B placed at the maintenance position P2, it is preferred to place the second beam member 32 above the operating position P1.

Namely, in case where the operator needs to access for the stage-changing operation accompanied by the type changing due to the alteration of the substrate type, maintenance operations for the exchange of an expendable part, or coping with substrate jamming due to transport errors, it is possible to pull out the first and second substrate-holding units 10A and 10B to the easily accessible maintenance position P2, resulting in the enhancement of working efficiency. By way of precaution, in the present embodiment, as the substrate-holding part, one comprising a plurality of substrate-holding units 10A and 10B has been exemplified, but, as a matter of course, a similar effect can be attained for a configuration comprising a single substrate-holding unit.

Figure 9:
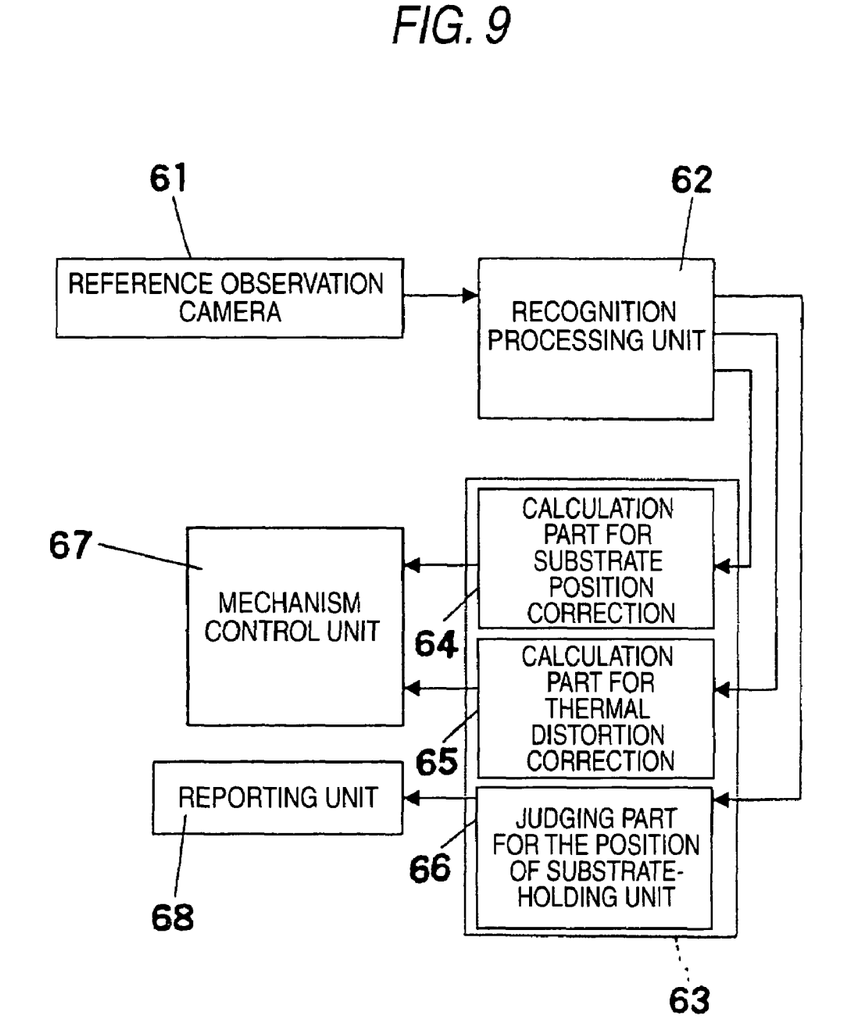
FIG. 9 is a block diagram showing the constitution of the control system for an electronic part mounting apparatus as one embodiment practicing the invention.

Now, with reference to FIG. 9, the constitution of the control system for the electronic part mounting apparatus is described. In FIG. 9, a reference observation camera 61 is a camera for capturing the image of the recognition marks 50a provided on the slide table 50 and the reference points provided on the first and second substrate-holding units 10A and 10B. As the reference observation camera 61, either of the first camera 35 mounted on the mounting head 34 for the purpose of substrate recognition, or the second camera 36 supported by the second beam member 32 so as to be freely movable in the X direction for the purpose of inspecting the mounted state of the chip 6 mounted on the substrate 16 may be used. But, it is preferable to use the first camera 35 which moves integrally with the mounting head 34 on which the camera is mounted.

The recognition-processing unit 62 conducts processing for recognizing the positions of the recognition marks 50a as the reference points using the image data acquired by the reference observation camera 61. The control unit 63 installs three processing functions of a calculation part for substrate position correction 64, a calculation part for thermal distortion correction 65 and a judgment part for the position of the substrate-holding unit 66, and conducts the processing to be explained below based on the result of the recognition processing by the recognition-processing unit 62.

First of all, the calculation part for substrate position correction 64 conducts the calculation for correcting the substrate position, i.e., the position of the substrate 16 held by the first or second substrate-holding unit 10A or 10B, based on the position of the recognition mark 50a recognized by the recognition processing unit 62. A calculation part for thermal distortion correction 65 conducts the calculation for correcting the error caused by the thermal distortion developing in each portion of the relevant mechanisms, based on the position of the reference point recognized by the recognition processing unit 62. Namely, when the apparatus is operated continuously for a certain period, each portion of the relevant mechanisms such as the feed screws and guides are heated due to the heat generated by the motors and the friction at the sliding portions, and a temporal change occurs in the relative position of each portion of the relevant mechanisms caused by the thermal distortion due to such temperature elevation. Thermal distortion correction corrects the temporal change in such relative positions by detecting the positions of the recognition marks 50a as the reference points at a pre-determined interval.

The calculation results of the calculation part for substrate position correction 64 and the calculation part for thermal distortion correction 65 are transmitted to the mechanism control unit 67. And when the mounting head 34, which has taken out a chip 6 from the electronic part feeding unit 2, mounts the chip 6 on the substrate 16, the mechanism control unit 67 controls the X direction and Y direction moving mechanisms on the basis of the aforementioned calculation results for substrate position correction and thermal distortion correction. By such control, the positional error for the substrate 16 caused by the displacement of the first and second substrate-holding units 10A and 10B and that of the mounting head 34 caused by the thermal distortion of each portion of the relevant mechanisms are corrected to correctly position the chip 6 relative to the substrate 16.

The judgment part for the position of the substrate-holding unit 66 similarly conducts processing for judging whether the first and second substrate-holding units 10A and 10B are correctly positioned or not, based on the position of the reference points detected by the recognition processing unit 62. The judgment result is sent to a reporting unit 68; in case where it is judged that the position of the first or second substrate-holding unit 10A or 10B is not correct, the reporting unit 68 makes a report of warning such incorrectness.

By such configuration, any trouble that might occur when the first or second substrate-holding unit 10A or 10B continues to work under a state incorrectly positioned at the operating position P1 due to a certain cause can be prevented during steps of repeating the action of moving the first or second substrate-holding unit 10A or 10B between the operating position P1 and the maintenance position P2. This judgment of the position of the substrate-holding unit can be performed by making use of the already provided reference observation camera without adding any new constituting element.

Figure 10:
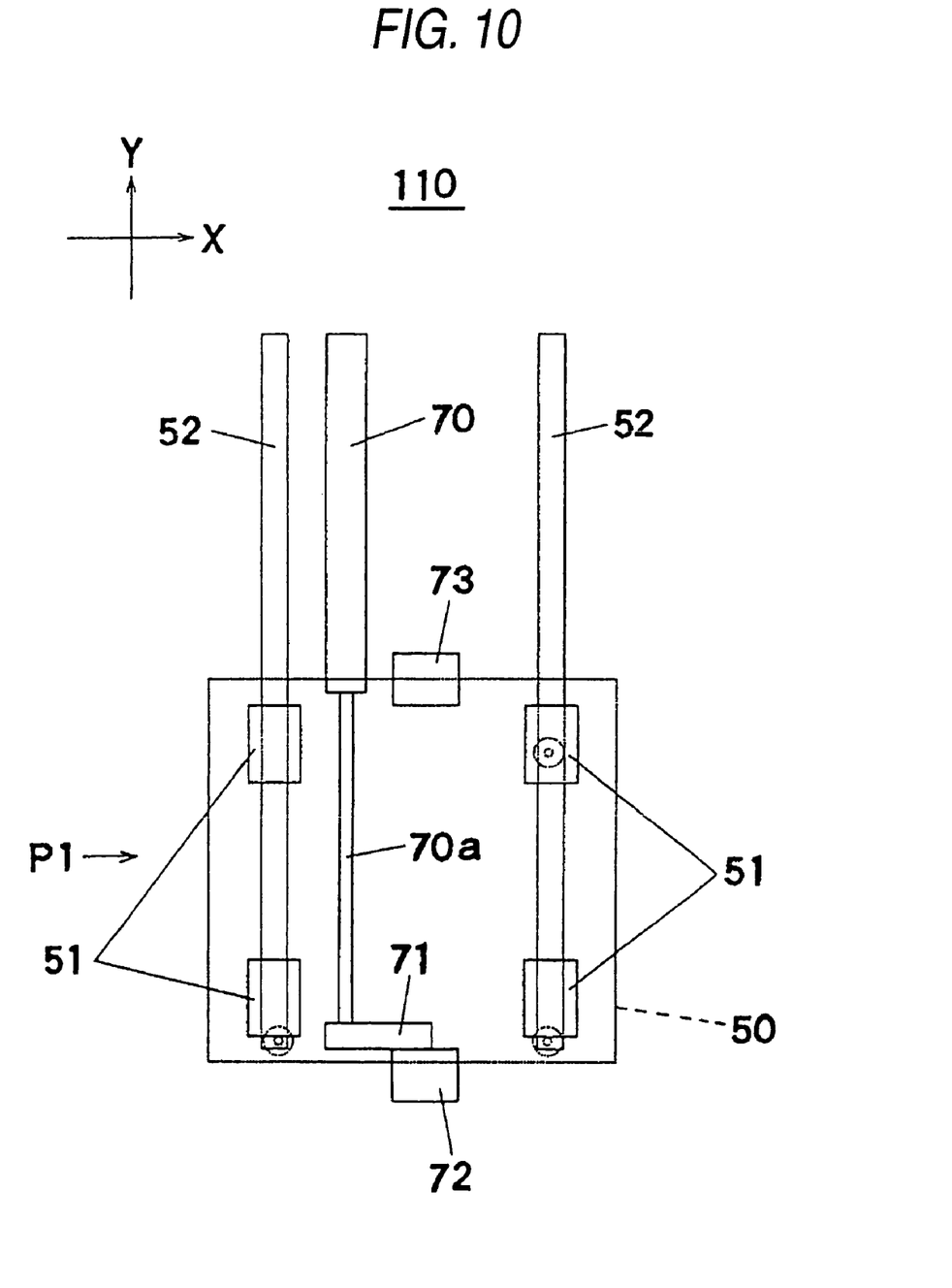
FIGS. 10 and 11 are plan views of the SHU-supporting mechanism of an electronic part mounting apparatus as one embodiment practicing the invention.
Figure 11:
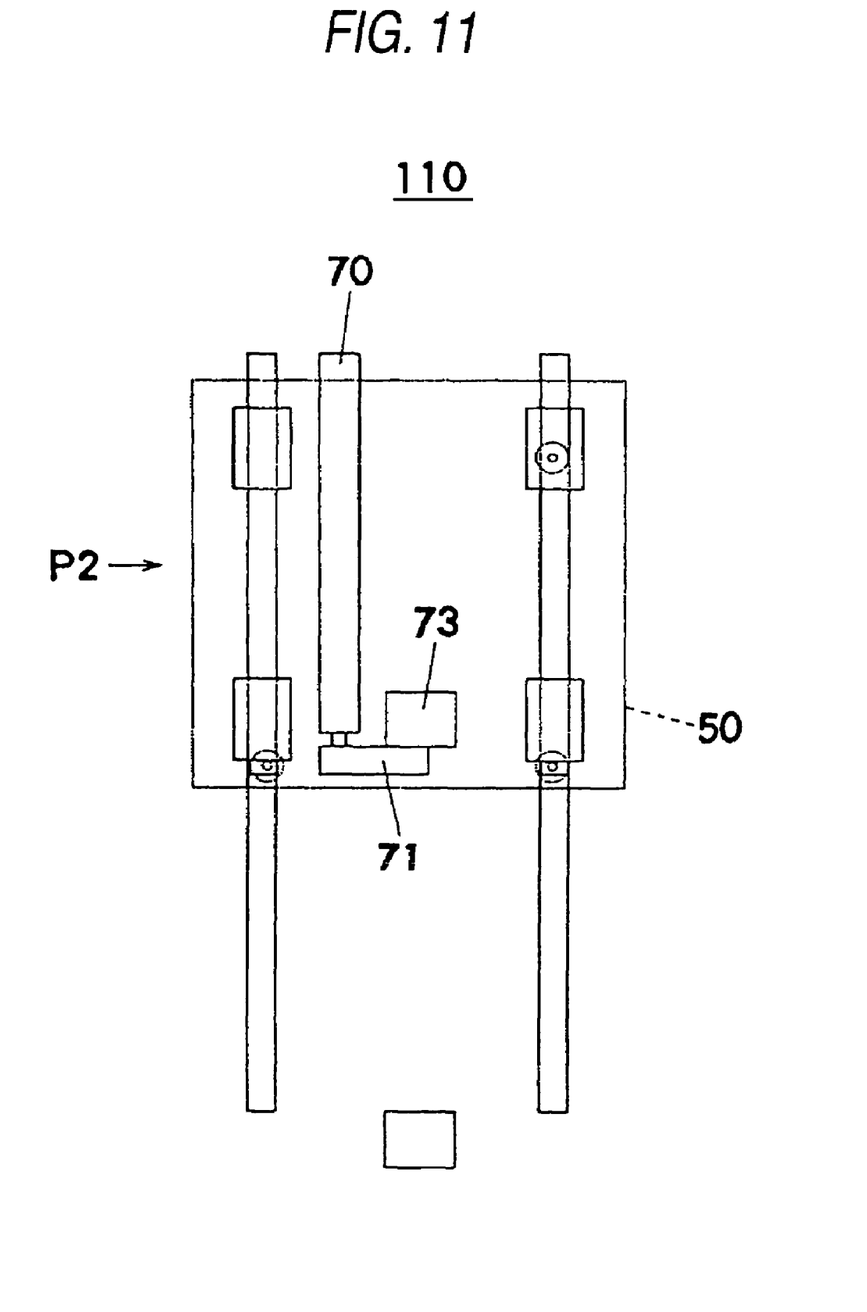

Meanwhile, in the above-described example, such a case was demonstrated in which the movement of the first and second substrate-holding units 10A and 10B between the operating position P1 and the maintenance position P2 is carried out by a manual operation by an operator to slide the slide table 50. But, as shown in FIGS. 10 and 11, an SHU-supporting mechanism 110 provided with an actuator which reciprocally moves the slide table 50 maybe adopted. Namely, according to this constitution, the SHU-supporting mechanism 110 includes the actuator which moves the first and second substrate-holding units 10A and 10B between the operation position P1 and the maintenance position P2. With this constitution, the slide table 50 can be moved automatically without any manual operation by the operator.

In FIG. 10, a slider 51, which is provided on the lower plane of the slide table 50, is provided on the guide rail 52 arranged on the upper plane of the base table 1 so as to be freely slidable in the Y direction as in the configuration example shown in FIG. 5. Between the two guide rails 52, an air cylinder 70 is arranged with the protruding or retreating direction of a rod 70a directed in the Y direction. A stopper 71 connected to the tip of the rod 70a is fixed at the lower plane of the slide table 50, and by protruding or recessing the rod 70a via the operation of the air cylinder 70, the slide table 50 moves reciprocally in the Y direction guided by the guide rails 52.

On the upper plane of the base table 1, positioning member 72 and 73 are arranged. And, as shown in FIG. 10, in the situation where the rod 70a protrudes so that the slide table 50 moves to the operating position P1, the stopper 71 comes in contact with the positioning member 72 and stops. Then, the slide table 50 is correctly positioned at the operating position P1 and fixed there since the stopper 71 is pushed against the positioning member 72 by means of the air cylinder 70. Namely, according to this configuration example, the air cylinder 70, the stopper 71 and the positioning member 72 constitute a fixing mechanism which fixes the slide table 50 at the operating position P1.

Further, FIG. 11 illustrates the situation of positioning the slide table 50 at the maintenance position P2 by retracting the rod 70a. Namely, since the stopper 71 comes into contact with the positioning member 73, the position of the slide table 50 is placed correctly at the maintenance position P2 and fixed there.

This application is based upon and claims the benefit of priority of Japanese Patent Application No. 2003-433143 filed on Dec. 26, 2003, the contents of which are incorporated herein by reference in its entirety.

INDUSTRIAL APPLICABILITY

The electronic part mounting apparatus of the invention has an advantage that the working efficiency improves through the improvement of the accessibility to the substrate-holding unit from outside, and is useful for an electronic part mounting apparatus with a configuration in which a plurality of beam members are moved on a common supporting frame.

The invention claimed is:

1. An electronic part mounting apparatus comprising: a nozzle which holds an electronic part by suction and which mounts the electronic part on a substrate by holding the electronic part with said nozzle by suction;
   a base table;
   a substrate-holding unit which is arranged in the central portion of the base table and holds said substrate;
   a substrate transporting mechanism which brings in the substrate to said substrate-holding unit or carries out the substrate from the substrate-holding unit by transporting the substrate in a substrate transportation in X direction;
   a pair of supporting frames arranged in both sides of said substrate so as to straddle the substrate transporting route defined by said substrate transport mechanism;
   an electronic part feeding unit arranged lateral to said substrate-holding unit between the pair of the supporting frames on said base table;
   a beam member which is held by said supporting frames at both ends thereof so as to be freely movable in the Y direction almost perpendicular to said substrate transport direction;
   a Y-axis moving mechanism which moves the beam member in the Y direction whereby the moving range includes the space above said substrate-holding unit and the space above said electronic part feeding unit;
   the mounting head which is held by said beam member so as to be freely movable in the X direction;
   an X-axis moving mechanism which move the mounting head in the X direction; and
   a substrate-holding unit supporting mechanism which supports said substrate-holding unit in such a manner that the substrate-holding unit can move between an operating position which allows said substrate transport mechanism to bring in or carry out the substrate and a maintenance position arranged farther away from said electronic part feeding unit in the Y direction than said operating position on a side opposite to said electronic part feeding unit.

2. The electronic part mounting apparatus set forth in claim 1 wherein said substrate-holding unit supporting mechanism includes an actuator which moves said substrate-holding unit between said operating position and said maintenance position.

3. The electronic part mounting apparatus set forth in claim 1 wherein said substrate-holding unit supporting mechanism is provided with a slide table which moves linearly substantially in the Y direction on said base table and said substrate-holding unit is provided on said slide table.

4. The electronic part mounting apparatus set forth in claim 3, further comprising: a fixing mechanism which fixes said slide table at said operating position.

5. The electronic part mounting apparatus set forth in claim 3, further comprising:
   an optically detectable reference point on said slide table or said substrate-holding unit,
   a reference observation camera which captures the image of said reference point,
   a recognition processing unit which recognizes the position of said reference point from the image acquired with said reference observation camera, and
   a position judging unit for the substrate-holding unit which judges whether the substrate-holding unit is accurately positioned at said operating position based on the position of said reference point recognized by said recognition processing unit.

6. The electronic part mounting apparatus set forth in claim 3 wherein further comprising:
- an optically detectable reference point arranged on said slide table or said substrate-holding unit,
- a reference observation camera which captures said reference point,
- a recognition processing unit which recognizes the position of said reference point from the image acquired by said reference observation camera, and
- a calculating unit for thermal distortion correction which corrects the error caused by thermal distortion based on the position of said reference point recognized by said recognition processing unit.

7. The electronic part mounting apparatus set forth in claim 3 further comprising:
- an optically detectable reference point arranged on said slide table or said substrate-holding unit,
- a reference observation camera which captures said reference point,
- a recognition processing unit which recognizes the position of said reference point from the image acquired by said reference observation camera,
- a position judging unit for the substrate-holding unit which judges whether the substrate-holding unit is accurately positioned at said operating position based on the position of said reference point recognized by said recognition processing unit, and
- a calculating unit for thermal distortion correction which corrects the error caused by thermal distortion based on the position of said reference point recognized by said recognition processing unit.

8. The electronic part mounting apparatus set forth in claim 5 wherein said reference observation camera is a camera used for the recognition of the substrate.

9. The electronic part mounting apparatus set forth in claim 5 wherein said reference observation camera is a camera mounted on said mounting head.

10. The electronic part mounting apparatus set forth in claim 5 wherein said reference observation camera is a camera used for the inspection of the mounted condition of the electronic part mounted on the substrate.

11. The electronic part mounting apparatus set forth in claim 5 further comprising:
- a second beam member supported by said supporting frame at both ends thereof so as to be freely movable in the Y direction, and
- a second Y-axis moving mechanism which moves the second beam member in the Y direction between the upward space of said substrate-holding unit and are treating position arranged remote from said electronic part feeding unit in the Y direction beyond the upward space of this substrate-holding unit,
- wherein said reference observation camera is supported by said second beam member so as to be freely movable in the X direction.

12. The electronic part mounting apparatus set forth in claim 6 wherein said reference observation camera is a camera used for the recognition of the substrate.

13. The electronic part mounting apparatus set forth in claim 6 wherein said reference observation camera is a camera mounted on said mounting head.

14. The electronic part mounting apparatus set forth in claim 6 wherein said reference observation camera is a camera used for the inspection of the mounted condition of the electronic part mounted on the substrate.

15. The electronic part mounting apparatus set forth in claim 6 further comprising:
- a second beam member supported by said supporting frame at both ends thereof so as to be freely movable in the Y direction, and
- a second Y-axis moving mechanism which moves the second beam member in the Y direction between the upward space of said substrate-holding unit and are treating position arranged remote from said electronic part feeding unit in the Y direction beyond the upward space of this substrate-holding unit,
- wherein said reference observation camera is supported by said second beam member so as to be freely movable in the X direction.

16. The electronic part mounting apparatus set forth in claim 7 wherein said reference observation camera is a camera used for the recognition of the substrate.

17. The electronic part mounting apparatus set forth in claim 7 wherein said reference observation camera is a camera mounted on said mounting head.

18. The electronic part mounting apparatus set forth in claim 7 wherein said reference observation camera is a camera used for the inspection of the mounted condition of the electronic part mounted on the substrate.

19. The electronic part mounting apparatus set forth in claim 7 further comprising:
- a second beam member supported by said supporting frame at both ends thereof so as to be freely movable in the Y direction, and
- a second Y-axis moving mechanism which moves the second beam member in the Y direction between the upward space of said substrate-holding unit and are treating position arranged remote from said electronic part feeding unit in the Y direction beyond the upward space of this substrate-holding unit,
- wherein said reference observation camera is supported by said second beam member so as to be freely movable in the X direction.

20. The electronic part mounting apparatus set forth in claim 1, wherein said substrate transporting mechanism is located in the middle of said base table in the Y direction and extends in the X direction from one edge of said base table to the other edge of said base table.

* * * * *